(12) United States Patent
Brown et al.

(10) Patent No.: US 8,389,864 B2
(45) Date of Patent: Mar. 5, 2013

(54) WARP REACTIVE IC PACKAGE

(75) Inventors: Paul James Brown, Wakefield (CA);
Alex L. Chan, Ottawa (CA)

(73) Assignee: Alcatel Lucent, Paris (FR)

( * ) Notice: Subject to any disclaimer, the term of this patent is extended or adjusted under 35 U.S.C. 154(b) by 201 days.

(21) Appl. No.: 12/895,062

(22) Filed: Sep. 30, 2010

(65) Prior Publication Data
US 2012/0081871 A1 Apr. 5, 2012

(51) Int. Cl.
*H05K 1/03* (2006.01)

(52) U.S. Cl. .......... 174/255; 361/783; 174/260

(58) Field of Classification Search .......... 174/255, 174/260, 261; 361/760, 782, 783, 795
See application file for complete search history.

(56) References Cited

U.S. PATENT DOCUMENTS

| | | | | |
|---|---|---|---|---|
| 5,958,556 | A * | 9/1999 | McCutcheon | 428/172 |
| 6,049,038 | A * | 4/2000 | Suzuki | 174/539 |
| 6,386,890 | B1 * | 5/2002 | Bhatt et al. | 439/67 |
| 6,743,026 | B1 * | 6/2004 | Brodsky | 439/73 |
| 7,517,230 | B2 * | 4/2009 | Colbert et al. | 439/73 |
| 7,930,820 | B2 * | 4/2011 | McAllister et al. | 29/830 |
| 2009/0286108 | A1 * | 11/2009 | Kim et al. | 429/12 |

* cited by examiner

*Primary Examiner* — Yuriy Semenenko
(74) *Attorney, Agent, or Firm* — Kramer & Amado P.C.

(57) ABSTRACT

An apparatus and method for temperature induced warpage compensation in an integrated circuit package is disclosed. The apparatus consists of a layer of material bonded to the top of the integrated circuit package. The layer of material may have a generally planar-convex or a generally planar-concave cross-section. By appropriate choice of temperature coefficient and degree of concavity or convexity, the layer of material can compensate for either convex or concave warpage. In some embodiments the layer of material has apertures therein allowing compensation for more complex warpages. The apparatus provides an alternative to apparatus for dealing with IC package warpage known in the art.

8 Claims, 3 Drawing Sheets

FIG. 2a
PRIOR ART
FIG. 2b
PRIOR ART
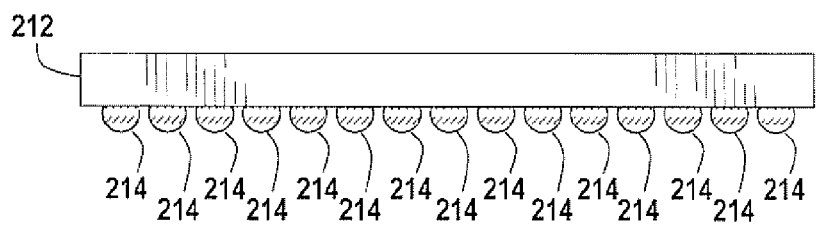
FIG. 2c
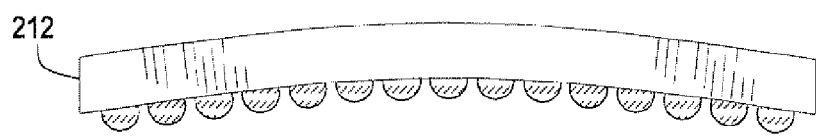
FIG. 2d

WARP REACTIVE IC PACKAGE

FIELD OF THE INVENTION

The invention relates to warping of integrated circuit (IC) packages during manufacturing processing and is particularly concerned with providing a means for generally neutralizing the warpage by use of a counter-warping element.

BACKGROUND OF THE INVENTION

A wide variety of semiconductor packages having integrated circuits (IC) are used in industry. In general, ICs and their packages have been becoming more complex over time, with the result that their power, speed and their size has been increasing. With increased size and complexity also arise an increased number of connections from the integrated circuit to the larger electronics assembly of which it is a part. Historically, pin counts of Very Large Scale Integrated (VLSI) circuits exceeded the limits for dual in-line packaging (DIPs), leading to development of the Pin Grid Array (PGA). In the PGA the inputs and outputs of the integrated circuit are connected to an integrated circuit package in which pins are arranged in a square array that may or may not cover the bottom of the package. The pins conduct electrical signals from the integrated circuit to the printed circuit board (PCB) in which the IC package is mounted. A subsequent development is that of the Ball Grid Array, or BGA, in with the pins are replaced by balls of solder affixed to the bottom of the integrated circuit package. During assembly to the printed circuit board, the BGA is heated, causing the solder balls to melt and solder the package to the printed circuit board.

As the BGA packaging offers additional advantages, such as improved heat conduction due to the lower thermal resistance between the package and PCB, a lower inductance connection than pins, and reduced solder connection bridging; it has become a preferred packaging type.

One disadvantage of BGAs however, is the requirement for flatness during processing. In general, the solder connections require a tight mechanical tolerancing during processing in order to preclude mechanical stresses which would promote solder joint failure.

Working against this requirement, however, is the difference in thermal coefficient of expansion which exists between the substrate upon which the solder balls are mounted, and the silicon integrated circuit mounted upon the substrate. The differences in the thermal coefficient of expansion lead to warpage of the BGA package as a whole. This warpage, which for the purposes of this specification refers to a bending or twist or general lack of flatness in the overall integrated circuit package, including in particular the plane formed by the solder joint locations, can cause a variety of problems. A non-exhaustive list by way of example includes problems such as fractured solder joints, open contact solder joints, pillowed joints, or intermittent contact solder joints.

The problem of warpage is exacerbated by larger package sizes, and by elevated processing temperatures. As trends in integrated circuit complexity are consistently in the direction of larger package sizes, and as production changes in the direction of lead free solders yield higher processing temperatures, the problem of integrated circuit warpage is a pressing one. It is important to note that the desired tolerance for flatness at and across the processing temperature range can be very high. For example, for BGA packages having a size of greater than 1" across, there may be a maximum warpage tolerance of on the order of 0.008" allowed.

One prior solution to the problem of IC package warping has been the incorporation on top of the IC of a flat stiffener plate. The stiffener plate takes the form essentially of a completely flat entirely planar item having a constant thickness, and is a simple rectangle having approximately its perimeter be the size of the IC package perimeter when viewed from the top. A central region of the flat stiffener plate may be cut out in certain applications, for example to allow access of a thermally conductive element.

However, these stiffener flat plates suffer from the disadvantage that they themselves are entirely flat, and thus, have a somewhat limited resistance to warping due to temperature change or torsion or bending forces. In order to make a flat plate strong enough to provide desirable resistance to warping in the overall IC package, it can be necessary to make the stiffening plate undesirably thick. It is undesirable for the stiffening plate, which rests on top of the IC, to be too thick because the thick stiffening plate, on top of and added to the IC thickness, causes the entire assembled IC package to be thick, thus potentially limiting IC packaging placement options and/or increasing printed circuit card to printed circuit card separation in the final system assembly.

Further, the added stiffener thickness increases the IC die-to-lid spacing, thereby creating a larger separation that needs to be filled with thermal interface material, the longer thermal path ultimately impeding thermal dissipation from the IC. Moreover, because of the stiffener's entirely flat cross-sectional profile, increased stiffness is achieved inefficiently though the increase of the overall volume of material, thus adding additional cost and weight to the final IC package.

In view of the foregoing, it would be desireable to provide a means of decreasing warpage of IC packages. In particular, it would be desirable to provide a means that can provide improved performance and/or mounting reliability while providing a desirable low degree of thickness and/or a desirable low amount of material.

SUMMARY OF THE INVENTION

It is an object of the invention to provide a temperature responsive warpage counteracting integrated circuit assembly.

According to an aspect of the invention there is provided a temperature responsive warpage counteracting integrated circuit assembly for use with an integrated circuit package having a connection grid side and a top side. The integrated circuit assembly has a layer of a material having a generally planar-convex cross-section; a temperature coefficient of expansion associated with the layer of material; the planar surface of material layer is bonded to the top side of the integrated circuit package; and the convexity is of sufficient degree for the temperature coefficient of expansion sufficient to counteract a warpage of the integrated circuit package.

Advantageously, in some versions of this embodiment the layer of material has at least one aperture therein. Additionally, in some versions of this embodiment the cross-section of the layer of material tapers in the vicinity of the at least one aperture. Alternatively, in some versions of this embodiment the cross-section of the layer of material thickens in the vicinity of the at least one aperture.

According to another aspect of the invention there is provided a temperature responsive warpage counteracting integrated circuit assembly for use with an integrated circuit package having a connection grid side and a top side. The integrated circuit assembly has a layer of a material having a generally planar-concave cross-section; a temperature coefficient of expansion associated with the layer of material; the planar surface of material layer is bonded to the top side of the integrated circuit package; and the concavity is of sufficient degree for the temperature coefficient of expansion sufficient to counteract a warpage of the integrated circuit package.

Advantageously, in some versions of this embodiment the layer of material has at least one aperture therein. Additionally, in some versions of this embodiment the cross-section of the layer of material tapers in the vicinity of the at least one aperture. Alternatively, in some versions of this embodiment the cross-section of the layer of material thickens in the vicinity of the at least one aperture.

Note: in the following the description and drawings that follow merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

BRIEF DESCRIPTION OF THE DRAWINGS

The present invention will be further understood from the following detailed description of embodiments of the invention, with reference to the drawings in which:

FIG. 2a illustrates another cross-sectional drawing of an integrated circuit package in accordance with the prior art;

FIG. 2b illustrates a cross-sectional drawing of the integrated circuit package of FIG. 2a which is showing a convex warpage due to elevated temperature;

FIG. 2c illustrates an exploded cross-sectional drawing of an integrated circuit package and a warpage compensation element in accordance with another embodiment of the present invention;

FIG. 2d illustrates a cross-sectional drawing of the integrated circuit package and warpage compensation element of FIG. 2c bonded together in accordance with an embodiment of the present invention;

Figure 1A:
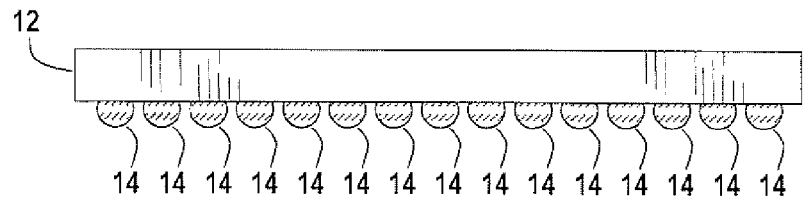
FIG. 1a illustrates a cross-sectional drawing of an integrated circuit package which in accordance with the prior art.

In the following figures, like features bear similar reference labels.

DETAILED DESCRIPTION

Referring now to the drawings, in which like numerals refer to like components or steps, there are disclosed broad aspects of various exemplary embodiments.

Many embodiments relate to a warpage reducing element that can be attached to an integrated circuit (IC) package. As used throughout this document, the terms IC (integrated circuit) and IC packaging are used interchangeably to make reference to the overall component assembly, which is also commonly referred to as the IC package. Examples of IC packages include for example TSOPS, QFPs, SOIC, BGA, CCGA, etc. It is noted that for packages containing above approximately 400 connections, IC packaging almost exclusively take on the form of Area Array style packaging, which itself can include various subtypes, such as for example Column Grid Arrays (CCGA), Pin Grid Arrays (PGA), and Ball Grid Arrays (BGA). The stiffener solutions that are described herein are applicable to such Area Array devices, including for example BGAs. The term IC assembly is used herein to refer to an IC or IC package that has a warpage reducing element incorporated therein or mounted thereto.

When referring herein to a plane, the reference includes the concept of a flat plate, which actually has a top and bottom flat surface and some thickness, with the top and bottom flat surfaces technically lying along parallel planes. Planar herein includes the concept of a plate being planar although it has such a thickness. Additionally, when referring herein to a planar-convex cross-section, the reference includes the concept of a plate having a flat bottom and a convex top surface. Likewise, when referring herein to a planar-concave cross-section, the reference includes the concept of a plate having a flat bottom and a concave top surface.

Referring to FIG. 1a there may be seen an integrated circuit 12 with a plurality of solder bumps 14. The solder bumps are for making connections to pads at a mounting location, for example on a printed circuit board.

Figure 1B:
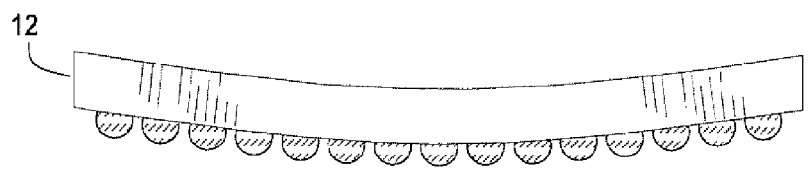
FIG. 1b illustrates a cross-sectional drawing of the integrated circuit package of FIG. 1a which is showing a concave warpage due to elevated temperature.

Referring to FIG. 1b there may be seen the integrated circuit 12 with an exaggerated depiction of the warpage effect of a high temperature. Such a high temperature may occur during processing, for example when the integrated circuit is being mounted on a printed circuit board. In the case of processing with lead free solders, this high temperature may be on the order of 260° C. in this case the resulting warpage is concave in nature. The warpage generally results from a mismatch between the thermal coefficient of expansion of the silicon integrated circuit die and the thermal coefficient of expansion of the IC carrier to which the silicon die is affixed.

Figure 1C:
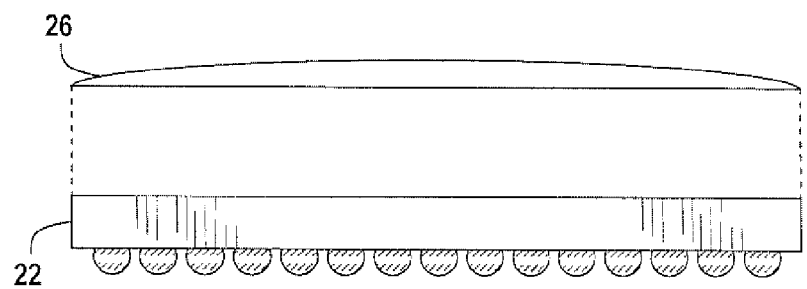
FIG. 1c illustrates an exploded cross-sectional drawing of an integrated circuit package and a warpage compensation element in accordance with an embodiment of the present invention.

Referring to FIG. 1c there may be seen an integrated circuit 22. Also depicted is a thermal warpage compensation element 26 having a planar-convex cross-section.

In FIG. 1c, thermal warpage compensation element 26 has a respective thermal coefficient of expansion. Due to the geometry of the cross-section of thermal warpage compensation element 26, a positive change in temperature will result in a greater degree of expansion of the thicker central section than the thinner peripheral sections. The net result of this greater degree of expansion, is to induce a warpage which is opposite in nature to the warpage of the integrated circuit 12 in FIG. 1b. The amount of warpage provided is a function of the specific thermal coefficient of expansion and the degree of convexity of thermal warpage compensation element 26.

Figure 1D:
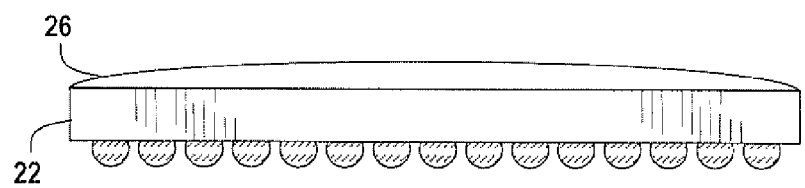
FIG. 1d illustrates a cross-sectional drawing of the integrated circuit package and the warpage compensation element of FIG. 1c bonded together in accordance with an embodiment of the present invention.

Referring to FIG. 1d there may be seen the resulting temperature responsive warpage counteracting integrated circuit assembly wherein thermal warpage compensation element 26 is bonded to the surface of integrated circuit 22. This bonding may be effected by appropriate adhesives.

Referring now to FIG. 2a there may be seen an integrated circuit 212 with a plurality of solder bumps 214. As previously described, the solder bumps are for making connections to pads at a mounting location, for example on a printed circuit board.

Referring to FIG. 2b there may be seen the integrated circuit 212 with an exaggerated depiction of the warpage effect of a high temperature. In this case the resulting warpage is convex in nature. This warpage generally results where the mismatch between the thermal coefficient of expansion of the silicon integrated circuit die and the thermal coefficient of expansion of the IC carrier to which the silicon die is affixed is opposite in nature to the situation depicted in FIG. 1b.

Referring to FIG. 2c there may be seen an integrated circuit 222. Also depicted is a thermal warpage compensation element 228 having a planar-concave cross-section.

In FIG. 2c, thermal warpage compensation element 228 has a respective thermal coefficient of expansion. Due to the geometry of the cross-section of thermal warpage compensation element 228, a positive change in temperature will result in a greater degree of expansion of the thicker peripheral sections than the thinner central section. The net result of this greater degree of expansion, is to induce a warpage which is opposite in nature to the warpage of the integrated circuit 212 in FIG. 2b. The amount of warpage provided is a function of the specific thermal coefficient of expansion and the degree of concavity of thermal warpage compensation element 228.

Referring to FIG. 2d there may be seen the resulting temperature responsive warpage counteracting integrated circuit assembly wherein thermal warpage compensation element 228 is bonded to the surface of integrated circuit 222. This bonding may be effected by appropriate adhesives.

According to some versions of embodiments of the invention, the convex or concave curve of the cross-section need not be smooth, but may be built of steps. Such steps may be provided, for example, by successive concentric layers.

Figure 3:
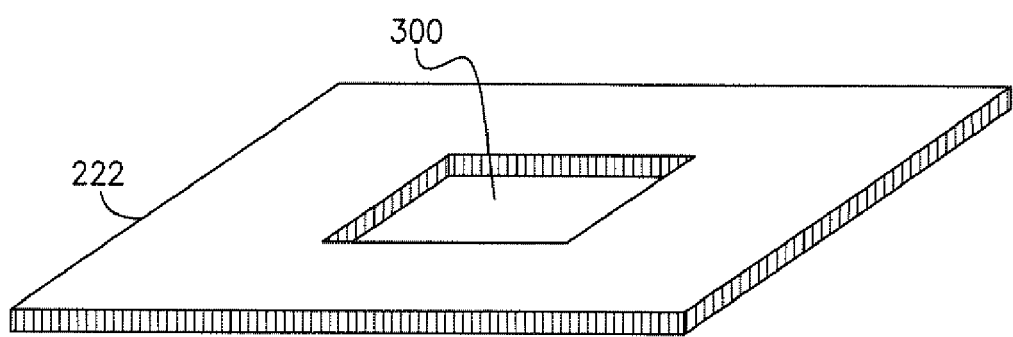

According to other contemplated embodiments, as depicted in FIG. 3, the thermal warpage compensation element 228 may have one or more apertures 300 placed therein. These apertures 300 will relieve the bending forces provided by the compensation element 228. Such a relief may be useful in situation wherein there is little warpage in the vicinity of the silicon die, and thus warpage counteracting compensation is unnecessary. Such apertures may also be useful in embodiments wherein more complex warpages than simple convex or simple concave warpages exist. As the counteracting forces tend to zero force in the vicinity of the aperture 300, warpage compensation can be tailored more precisely to the needs of a particular integrated circuit package 222. Additionally, in versions of this embodiment of the invention, the cross-section of the thermal warpage compensation element 228 may take on a shape coordinating with the apertures 300. For example, in the case of a single central aperture 300 the cross-section may take on the shape of a half-torus, tapering from a highest point to both the periphery and center.

In summary, an apparatus has been disclosed which provides a means to counteract the warpage of integrated circuit packages at elevated temperatures. In some embodiments the apparatus consists of a thermal warpage compensation element having a planar-convex cross-section wherein the planar surface is bonded to the top side of the integrated circuit package. In another embodiment the apparatus consists of a thermal warpage compensation element having a planar-concave cross-section wherein the planar surface is bonded to the top side of the integrated circuit package. In some versions of these embodiments the thermal warpage compensation element has apertures therein. In some versions of the embodiments with apertures, the thermal warpage compensation element may take on a shape coordinated with the aperture, tapering in thickness or increasing in thickness proximate to the aperture.

It is to be understood that various changes in the details, materials, and arrangements of the parts which have been described and illustrated in order to explain the nature of this invention may be made by those skilled in the art without departing from the scope of the invention as expressed in the following claims.

It should also be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation." Numerous modifications, variations and adaptations may be made to the embodiment of the invention described above without departing from the scope of the invention, which is defined in the claims.

What is claimed is:

1. A temperature responsive warpage counteracting integrated circuit assembly for use with an integrated circuit package having a connection grid side and a top side, said integrated circuit assembly comprising:
    a layer of material having a generally planar-convex cross-section, wherein a temperature coefficient of expansion is associated with said layer of material, a planar surface of the layer of material is bonded to the top side of said integrated circuit package, and convexity of the layer of material is sufficient for said temperature coefficient of expansion to counteract a warpage of said integrated circuit package.

2. The temperature responsive warpage counteracting integrated circuit assembly as claimed in claim 1, wherein said layer of material has at least one aperture therein.

3. The temperature responsive warpage counteracting integrated circuit assembly as claimed in claim 2, wherein said cross-section of said layer of material tapers in a vicinity of said at least one aperture.

4. The temperature responsive warpage counteracting integrated circuit assembly as claimed in claim 2, wherein said cross-section of said layer of material thickens in a vicinity of said at least one aperture.

5. A temperature responsive warpage counteracting integrated circuit assembly for use with an integrated circuit package having a connection grid side and a top side, said integrated circuit assembly comprising:
    a layer of material having a generally planar-concave cross-section, wherein a temperature coefficient of expansion is associated with said layer of material, a planar surface of the layer of material is bonded to the top side of said integrated circuit package, and concavity of the layer of material is sufficient for said temperature coefficient of expansion to counteract a warpage of said integrated circuit package.

6. The temperature responsive warpage counteracting integrated circuit assembly as claimed in claim 5 wherein said layer of material has at least one aperture therein.

7. The temperature responsive warpage counteracting integrated circuit assembly as claimed in claim 6, wherein said cross-section of said layer of material tapers in a vicinity of said at least one aperture.

8. The temperature responsive warpage counteracting integrated circuit assembly as claimed in claim 6, wherein said cross-section of said layer of material thickens in a vicinity of said at least one aperture.

\* \* \* \* \*